Figure 1:
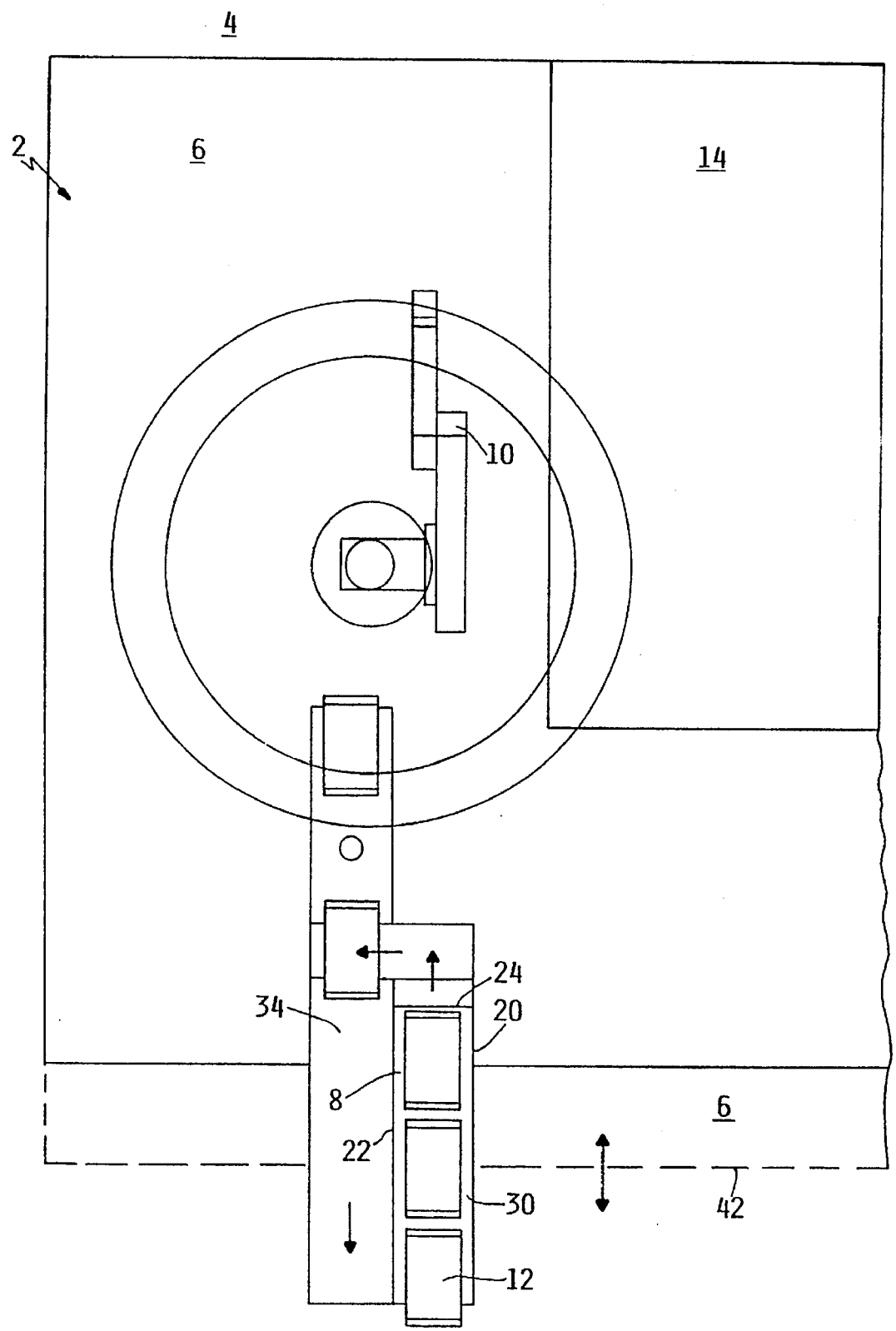

United States Patent [19]
Swoboda et al.

[11] Patent Number: 5,660,585
[45] Date of Patent: Aug. 26, 1997

[54] FACILITY AND METHOD FOR THE HANDLING OF OBJECTS

[75] Inventors: Bruno Swoboda, Mainz; Juergen Schwarze, Saulheim; Ingo Wild, Mainz, all of Germany

[73] Assignee: International Business Machines Corporation, Armonk, N.Y.

[21] Appl. No.: 157,026
[22] PCT Filed: Apr. 2, 1993
[86] PCT No.: PCT/DE93/00274
§ 371 Date: Jul. 28, 1994
§ 102(e) Date: Jul. 28, 1994
[87] PCT Pub. No.: WO93/20580
PCT Pub. Date: Oct. 14, 1993

[30] Foreign Application Priority Data

Apr. 2, 1992 [DE] Germany ............... 42 10 960.4

[51] Int. Cl.⁶ ............................................. F24F 3/16
[52] U.S. Cl. ............................................. 454/187; 134/902
[58] Field of Search ............... 454/187; 134/902; 414/217, 222, 935, 940

[56] References Cited

U.S. PATENT DOCUMENTS

| | | |
|---|---|---|
| 4,851,018 | 7/1989 | Lazzari et al. . |
| 5,044,871 | 9/1991 | Davis et al. ............... 414/217 X |
| 5,058,491 | 10/1991 | Wiemer et al. . |
| 5,143,552 | 9/1992 | Moriyama ............... 118/666 |
| 5,363,867 | 11/1994 | Kawano et al. ............ 414/940 X |

FOREIGN PATENT DOCUMENTS

| | | |
|---|---|---|
| 0 273 791 | 7/1988 | European Pat. Off. . |
| 0 335 752 | 10/1989 | European Pat. Off. . |

*Primary Examiner*—Harold Joyce
*Attorney, Agent, or Firm*—Matthew J. Bussan

[57] ABSTRACT

Facility and method for the production of objects which require clean-room conditions in manufacture, wherein a clean-room area includes a working area (6) and a cleaning area (8), and the receptacles (12) transported into this working area (6) are cleaned by an ionic current.

7 Claims, 2 Drawing Sheets

FACILITY AND METHOD FOR THE HANDLING OF OBJECTS

The invention in question concerns a clean-room island for the manufacture of objects, in particular semiconductors, memory boards, medicaments, pharmaceutical articles, foodstuffs etc., and a method of clean-room handling of objects, stored in receptacies, which require clean-room conditions in manufacture.

For the manufacture and processing of various objects, such as semiconductors, medicaments, pharmaceutical articles and the like, the cleanest possible ambient air conditions are required. To achieve this, various classes of clean-room were defined by clean-room technologists, each permitting specific particle sizes and quantities. These classes begin with clean-room class 10000, which is the poorest level, and end with class 0.01, which is the best. In between, there are the classes 1000, 100, 10, 1, 0.1. In order to achieve a certain class of clean-room, an enormous amount of apparatus is required. In addition, even if the equipment guarantees an adequate class of clean-room, the objects are very quickly contaminated once more by the persons handling them. The effort required to achieve the right clean-room conditions increases from class to class, and has led to the design of a variety of systems in which the handlers are enclosed in an astronaut-type suit connected to an air supply, so that all contact between the persons handling the objects and the objects themselves is avoided.

An improvement in this regard was brought about by the so-called SMIF (Standard Mechanical Interface) concept from the ASYIST company, as described in the Journal Solid State Technology, July 1984, page 111, and in the U.S. Pat. Nos. 4,995,430, 4,974,166, 4,859,137, 4,815,912, 4,739,882, 4,724,874, 4,674,936, 4,676,709, 4,674,939 and the EP OS 292235, 288455. The subjects of the claims in these publications refer to individual elements of this concept. The basic point of the concept is that the objects to be worked on in a clean-room environment, in this case semiconductor wafers, are processed in a clean-room environment and are sealed in receptacles in that clean-room environment. These receptacles are able to maintain a certain clean-room class, although there are special so-called active receptacles which additionally filter the air in the receptacles and thus are able to maintain a higher level of clean-room class. These receptacles are then taken by the handlers to another processing station. The area in which the handlers are working must necessarily be a poorer class of clean-room. The receptacles are then inserted into a specially-designed interface device, which opens the receptacle in a specific way from below, in order to prevent the dirt particles deposited on the exterior surface of the receptacle during transit from coming into contact with the objects or entering the clean-room area when the receptacle is opened. From this device, the objects (semiconductor wafers) then enter the clean-room in which further processing is to be carried out. This concept has the disadvantage that it requires relatively large clean-room areas with high clean-room quality, and additionally a clean-room design and receptacle construction which is precisely adapted to the interface device. The concept is therefore not universally adaptable for other objects, such as memory boards, medicaments or other objects. The DE-OS 38 26 925 reveals a facility for the handling and treatment of objects sensitive to contamination, such as semiconductor components or similar products under clean-room conditions, with at least one clean-room area containing work surfaces for the treatment of the objects and an operator area of a lower clean-room level, in which the objects are accommodated, handled and transported in cassette-type containers or the like. In the operator area at least one mobile trolley is provided, incorporating at least one principally enclosed compartment with the means of storing a number of cassettes, whereby in this room a specific facility on the trolley itself is dedicated to the permanent maintaining of clean-room conditions in the compartment in which the cassettes are stored. In FIG. 1 and the related description, large-area clean-room installations are described, in which the products are always held in clean-room conditions, including during transportation, by means of the specially-designed trolley.

From the Journal "Reinraumtechnik", 1990, volume 5, pages 40–43, the protection of product surfaces by ionization is familiar. In this process, the surfaces of components are neutralized by correspondingly charged positive or negative air ions. The article describes how, within a short space of time, the particle deposits on wafers for particles larger than 1 μm can be reduced by a factor of 16.

In the U.S. Pat. No. 4,851,018, a trolley is described which can take receptacles from a clean-room area, transport them in clean-room atmosphere and pass them into a second clean-room area. This trolley also contains elaborate facilities for the maintaining of clean-room conditions.

The invention in question here is therefore based on the object of indicating a facility and a method which permits the construction of a clean-room production location which is universally adaptable to any objects, with a minimum of space requirement for clean-room zones with high levels of clean-room quality.

This object is achieved for a clean-room island as claimed in the patent claims. According to them, the clean-room island has a clean-room area shielded from the environment, within which a working area and a cleaning area are provided for. The clean-room area may, for example, be of clean-room class 100 and below, while the surrounding environment is clean-room class 10000 and above. The clean-room area is of a clean-room class better by a factor of 1000 than that of the environment. Both the working area and the cleaning area are arranged in such a way that the necessary clean-room class for the clean-room area is ensured in both areas. In the working area there are handling appliances and the process equipment necessary for the process to be carried out in this clean-room area. The cleaning area of the zone surrounding the objects and cleaning equipment is separated at least in respect of the ambient atmosphere from the working area, that is to say it must be ensured during cleaning in the cleaning area that no dirt particles can enter the working area. Furthermore, in the cleaning area a receiving device is provided for the accommodation of at least one receptacle containing objects to be processed, whereby the receptacle is placed in the receiving device either by machine or by a handler. Furthermore, in the cleaning area there is cleaning equipment suitable for cleaning dirt particles from at least one receptacle by means of an ionized fluid. These types of cleaning device are familiar as ion spray jets for air or for fluids.

The cleaning equipment is aligned above the receiving device and sprays ionized air onto at least one receptacle. The clean-room air from the cleaning area which is then contaminated with particles can be sucked out through openings in the receiving device by extractors aligned below the receiving device, and fed to the central air cleaning plant for clean-rooms. In this way it is ensured that the dirt particles are extracted by a specifically-targeted process from the cleaning area, and any possible contamination of the clean-room air in the working area is prevented.

The cleaning area can be constructed as a fully-enclosed chamber, although it has been shown that it is sufficient if the cleaning area is separated from the clean-room area by a partition wall. The receptacle can thus be moved from the one side, where the handler is working, into the cleaning area and, after cleaning, can be moved into the working area when the partition wall is opened. As the clean-room air contaminated after cleaning is sucked out of the cleaning area (before the partition wall is opened), a clean-room environment equal to the environment in the working area is very quickly achieved. Opening the partition wall to pass the cleaned receptacle into the working area does not contribute to contamination of the working area. This arrangement makes it possible for any kinds of receptacle, of various designs according to the objects being processed, to be passed into the clean-room area, and in particular into the working area, without the requirement of any further adaptation. This facility can therefore be employed at low cost as an island option in any manufacturing area and for any manufacturing industry requiring such facilities.

For the sake of practicality, the receiving device is a transport system which transports the objects from the cleaning area into the working area. For example, the transport system works on the principle of a travelling beam. This means that the individual transport elements are practically stationary in the direction of travel, and thus always remain in their own area. This prevents particles being carried through, and special cleaning of the transport system is not necessary. This supports automated production as, after cleaning of the receptacle and opening of the partition wall between the working area and the cleaning area, the transport system transports the cleaned receptacle under automatic control into the working area, so that it can be received there by an appropriate handling appliance. For reasons of simplification, it is beneficial if the transport system runs in a straight line, that is to say the moveable partition wall is aligned opposite the open side. Of course, for design reasons it may be necessary to provide a differently arranged transport system or, correspondingly, another opening partition wall between the cleaning area and the working area. After automatic identification of the receptacle, the handling appliance can then open the receptacle, remove the objects and arrange them appropriately for a subsequent processing stage. After processing the objects are stored once more in a receptacle by the handling appliance, sealed and made ready for further transportation out of the clean-room area.

In the method for clean-room handling of objects requiring clean-room conditions in manufacture according to the invention, the following steps are carried out:

Firstly the objects are worked on in an initial clean-room area which has the necessary class of clean-room environment for working.

Then the objects are placed in a receptacle and sealed, whereby this receptacle is able to maintain the clean-room class during transport.

Next the receptacles are transported, usually manually but also by machine, to a second clean-room area. This transportation may be over long distances, whereby the areas through which the receptacles are transported usually have a significantly worse class of clean-room environment.

Then the receptacles are placed in this second clean-room area, which has the necessary clean-room environment for the next processing stage.

When the receptacle has been brought into the second clean-room area it is cleaned of dirt particles by means of ionized air, and thereafter the receptacle is opened and the objects removed for further processing.

This method, with the various individual steps, can then be applied in as many further clean-room islands as desired. In the cleaning of the receptacle, the air flows from top to bottom over the receptacle.

The facility and method represented in this invention provide an overall concept for a complete clean-room system which encapsulates the product in receptacles and transports it from a clean-room area via a non clean-room area into another clean-room. The entire concept is independent of the product, of the corresponding receptacle and of the transport route. All of these can be individually adapted, so that application for any products is possible. Local clean-rooms (islands) are only constructed for the product processing area, and are therefore independent of the remaining production area. Subsequent installation and integration into existing production lines is thus possible.

The concept described above and the associated method permit the low-cost application of clean-room islands in production sectors of any kind, and are thus a low-cost alternative to the familiar methods for prior art facilities.

Figure 2:
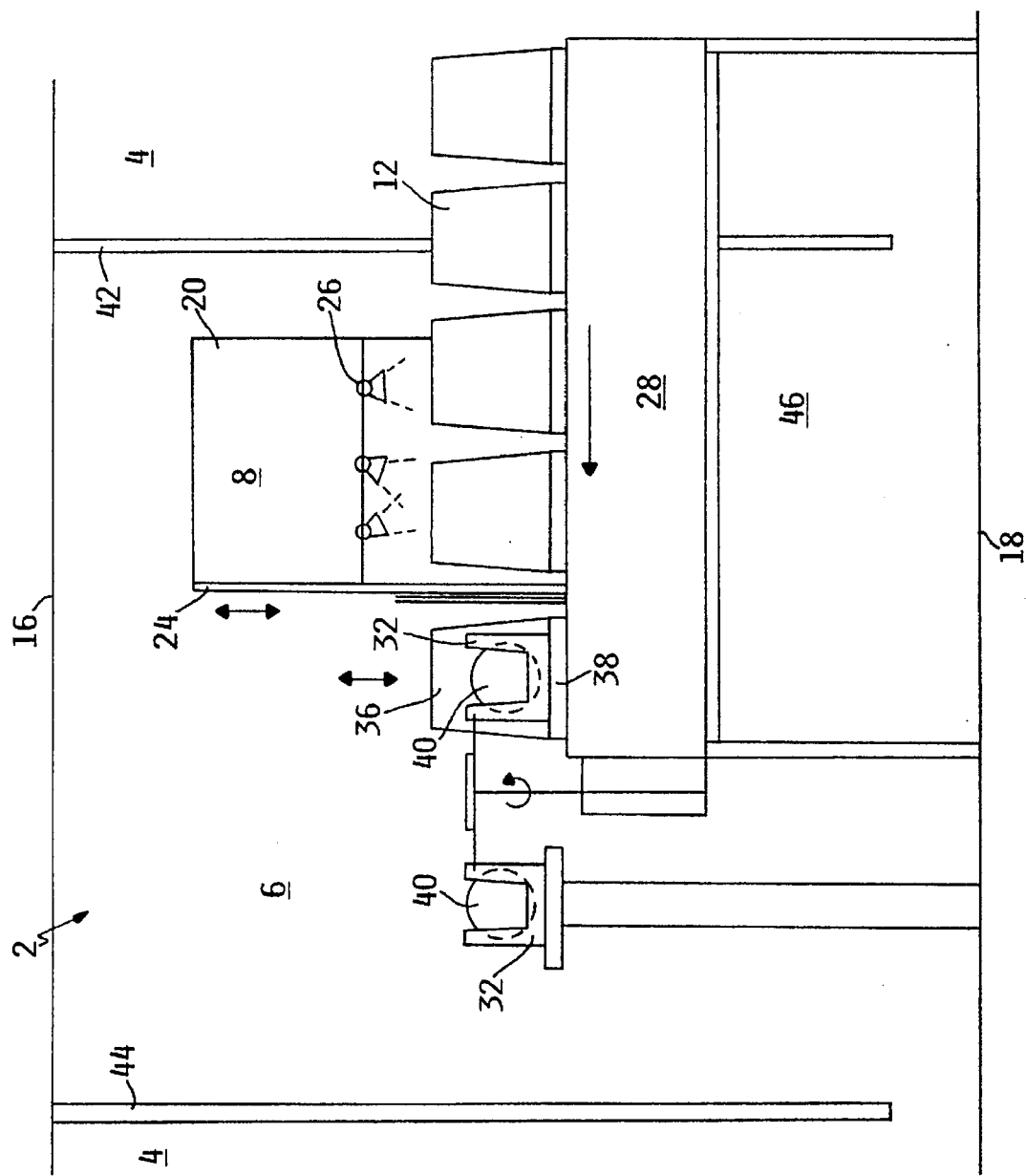

For the sake of better understanding, the invention is described in more detail in the following on the basis of an embodiment of the invention. The drawings show:

FIG. 1 A schematic top view of a local clean-room area with a working area and a cleaning area, for the passing of the receptacles from the lower-class clean-room area to the higher-class clean-room area; and FIG. 2 A schematic cross-section through a local clean-room area with cleaning area.

FIG. 1 shows a local clean-room area 2 (clean-room island) which is separated from the surrounding area 4 in respect of the cleaned air. The clean-room area 2 can, for example, receive air of clean-room class 100 and the surrounding area air of clean-room class 100000. Area 4 is the production area in which persons operating and maintaining the various equipment are located. The clean-room area 2 has the usual clean-room facilities for maintaining this kind of clean-room class. These include a laminar air flow from top to bottom so that, as a result of, the overpressure in clean-room area 2, dirt particles from the surrounding area cannot enter the said clean-room area 2, and partition walls between the clean-room area 2 and the surrounding area 4 can also be provided.

In order to ensure the proper air ducting for this purpose, air deflector baffles (skirts) are usually fixed to the ceilings 42, 44, depending on the height at which work on the product in the clean-room area is to be carried out. Skirt 42 of course has an opening in the area of the transport system. Clean-room area 2 is divided into a working area 6 and a cleaning area 8. In the working area 6 there is, for example, an automatic handling appliance 10 which removes the objects to be processed from a receptacle 12 and carries them to a processing machine 14.

The cleaning area 8 is of a clean-room class corresponding to that of the working area, but is separated from the working area 6 in respect of the laminar air flow of the clean-room air from the ceiling 16 to the floor 18 (FIG. 2). In the embodiment of the invention shown, the cleaning area 8 is open to the surrounding cleaning area 4 and merely has walls 20, 22, 24 dividing it from the working area 6, which prevent dirt particles from the cleaning area 8 entering the working area 6 together with the air flow. While the walls 20, 22 in the embodiment of the invention shown are fixed side walls, the wall 24 is constructed as a moveable partition wall which permits the transportation of cleaned receptacles 12 from the cleaning area 8 into the working area 6. Transportation is by means of a transport system, for example, which only allows transport if the moveable partition wall 24 is opened. In the cleaning area 8 above the receptacles 12 there are ion jets 26, which spray negative and positive ions by means of a simultaneously emitted compressed-air current onto the receptacles 12. This not only removes the electrical charge from the surfaces of the receptacles, but also blows dust particles from the surfaces. The resulting contaminated clean-room air from the cleaning area 8 is sucked out downwards through the transport system 28 through openings (not shown) by means of an extractor device 46 (schematically shown) and discharged into the air in the surrounding area 4. The moveable partition wall 24 is aligned opposite the open side 30 facing the surrounding area 4.

As already described, the cleaned receptacle 12 is transported from the cleaning area 8 into the working area 6 and is opened there by another handling appliance or by the handling appliance 10, and the objects to be processed are removed. These objects may also be arranged on an additional carrier 32, which is first removed from the receptacle 12 in an intermediate step and then set to a position which allows a handling appliance 10 to pass the objects arranged in the carrier 32 one-by-one to the processing machine 14.

In FIG. 2, a receptacle 12 with a lid 36 and a bottom section 38 is shown, wherein the bottom section 38 has a carrier 32 for the storage of semiconductor wafers 40, for example. The lid 36 is designed in the form of a hood covering, so that when the lid 36 is raised the carrier 32 is accessible, and in this way the entire process can be executed by machine.

Emptied receptacles 12 or receptacles 12 containing already processed objects 40 can be conveyed out of the working area 6 via a second transport system through the opening 34 into the surrounding area 4, where they can then be collected manually by a handler, or automatically, for further processing.

The schematic representation in FIG. 2 shows the receptacles 12 which are already deposited on the transport system in the surrounding area 4 with the significantly poorer clean-room class.

By means of the transport system 28, the receptacles 12 enter the significantly better clean-room area 2, separated by the skirts 42, 44 hanging from the ceiling which serve to ensure the desired air flow of clean air from the ceiling 16 to the floor 18. In the clean-room area 2 the cleaning area 8 is located, with the ion spray jets 26 for washing down the contaminated receptacles 12. The side wall 20 and the side wall shown 22, as well as the moveable partition wall 24, divide the cleaning area 8 in respect of clean-room conditions from the working area 6. In the embodiment of the invention shown the moveable partition wall 24 is constructed as a sliding partition. In FIG. 2, to the left of the moveable partition wall 24 there is a receptacle 12 which has already been cleaned, and which is opened in this position in order to remove the objects 40 and the carrier 32 from the bottom section, and to prepare the objects for further processing. For example, the handling appliance may be a lift-off rotary loader which removes the carrier and moves it to a working position. At the same time an emptied carrier is taken from the working position and placed on the bottom section 38, the lid 36 is lowered and the receptacle is sealed. Receptacles with empty carriers are then carried out by the parallel-running conveyor track.

This facility permits the clean-room handling of objects of any kind. In this, the objects are processed under clean-room conditions, then placed in a receptacle which is then sealed. The sealed receptacle, which is capable of maintaining the clean-room conditions which prevailed in processing during transportation, is removed from the clean-room area and brought into the area where the further processing of the objects is to take place. So that no contamination can enter the working area, the receptacle is cleaned in a cleaning area which is already of the clean-room class of the working area, and then conveyed into the working area. During cleaning the cleaning area is separated from the working area. After cleaning of the receptacles, the partition wall is only opened when the contaminated particles have been sucked out downwards, and in the cleaning area clean-room conditions corresponding to those of the working area have been re-established. The waiting time is dependent on the air flow rate and on the overall clean-room installation.

We claim:

1. A clean-room island for the processing of objects, said clean-room island comprising:

at least one clean-room area, said clean-room area having a clean-room class better than that of a surrounding environment by a factor of 1000, said clean-room area being divided into a working area and a cleaning area, said cleaning area being separated from said working area;

at least one transport system, said transport system being used for the transportation of at least one receptacle, said at least one receptacle containing an object for processing;

cleaning equipment in said cleaning area, said cleaning equipment being aligned above said transport system for cleaning dirt particles from said at least one receptacle by spraying said at least one receptacle with ionized air; and an extractor device aligned underneath said at least one transport system to suck out contaminated air from said cleaning area.

2. The clean-room island according to claim 1 wherein said cleaning area further comprises:

an opening on one side, said opening facing away from said clean-room area; and a moveable partition wall separating said cleaning area from said clean-room area.

3. The clean-room island according to claim 2 wherein said moveable partition wall is aligned opposite said opening.

4. The clean-room island according to claim 3 wherein said clean-room island further comprises an automatic handling appliance located in said working area, said automatic handling appliance being used to remove said object from said at least one receptacle.

5. A method for clean-room handling of an object stored in a receptacle which require clean-room conditions processing, said method comprising the steps of:

processing said object in a first clean-room island with a first class of clean-room environment;

placing said object in said receptacle and sealing said receptacle, said receptacle when sealed maintaining said first class of clean-room environment during transportation;

transporting said receptacle in an area having a clean-room class poorer by a factor of 1000 than that of a clean-room area;

placing said receptacle in a second clean-room island with a cleaning area which is of said first class of clean-room environment;

cleaning of dirt particles from said receptacle by spraying said receptacle with ionized air and extraction of contaminated air;

re-establishment of said first class of clean-room environment for processing in said cleaning area;

transportation of said receptacle directly into a working area; and automatically opening said receptacle and removing said object for further processing.

6. The method according to claim 5 wherein said cleaning step is carried out with an air flow which flows from top to bottom over said receptacle.

7. The method according to claim 5, wherein said automatically opening step further comprises the steps of:

removing said object from said receptacle and arranging said object appropriately for a subsequent processing stage; and replacing said object in said receptacle and sealing said receptacle after said subsequent processing stage is complete.

\* \* \* \* \*